US011822246B2

(12) United States Patent
Beyer et al.

(10) Patent No.: US 11,822,246 B2
(45) Date of Patent: Nov. 21, 2023

(54) RELIEF PRECURSOR HAVING LOW CUPPING AND FLUTING

(71) Applicant: Flint Group Germany GmbH, Stuttgart (DE)

(72) Inventors: Matthias Beyer, Weinheim (DE); Armin Becker, Großniedesheim (DE)

(73) Assignee: Flint Group Germany GmbH, Stuttgart (DE)

( * ) Notice: Subject to any disclaimer, the term of this patent is extended or adjusted under 35 U.S.C. 154(b) by 619 days.

(21) Appl. No.: 16/754,572

(22) PCT Filed: Oct. 5, 2018

(86) PCT No.: PCT/EP2018/077096
§ 371 (c)(1),
(2) Date: Apr. 8, 2020

(87) PCT Pub. No.: WO2019/072701
PCT Pub. Date: Apr. 18, 2019

(65) Prior Publication Data
US 2020/0348593 A1    Nov. 5, 2020

(30) Foreign Application Priority Data

Oct. 10, 2017  (EP) .................... 17195719

(51) Int. Cl.
| G03F 7/095 | (2006.01) |
| G03F 7/20 | (2006.01) |
| G03F 7/033 | (2006.01) |
| G03F 7/36 | (2006.01) |

(52) U.S. Cl.
CPC ............ *G03F 7/0955* (2013.01); *G03F 7/033* (2013.01); *G03F 7/202* (2013.01); *G03F 7/36* (2013.01)

(58) Field of Classification Search
CPC ........ G03F 7/0955; G03F 7/202; G03F 7/033; G03F 7/2014; G03F 7/2016; B41C 1/1008; B41C 1/1016; B41C 1/1033
See application file for complete search history.

(56) References Cited

U.S. PATENT DOCUMENTS

| 3,567,453 | A | 3/1971 | Borden |
| 3,615,629 | A | 10/1971 | Wilhelm et al. |
| 4,323,636 | A | 4/1982 | Chen |
| 4,343,891 | A | 8/1982 | Aasen et al. |
| 4,385,109 | A | 5/1983 | Lechtken et al. |
| 4,387,157 | A | 6/1983 | Bronstert et al. |
| 4,427,759 | A | 1/1984 | Gruetzmacher et al. |
| 4,460,675 | A | 7/1984 | Gruetzmacher et al. |
| 4,504,573 | A | 3/1985 | Ishikawa et al. |
| 4,517,277 | A | 5/1985 | Lynch et al. |
| 4,590,287 | A | 5/1986 | Riediker et al. |
| 4,713,401 | A | 12/1987 | Riediker et al. |
| 4,743,528 | A | 5/1988 | Farid et al. |
| 4,743,529 | A | 5/1988 | Farid et al. |
| 4,743,530 | A | 5/1988 | Farid et al. |
| 4,743,531 | A | 5/1988 | Farid et al. |
| 4,753,865 | A | 6/1988 | Fryd et al. |
| 4,849,307 | A | 7/1989 | Hoffmann et al. |
| 4,857,654 | A | 8/1989 | Riediker et al. |
| 5,026,625 | A | 6/1991 | Riediker et al. |
| 5,061,606 | A | 10/1991 | Telser et al. |
| 5,262,275 | A | 11/1993 | Fan |
| 8,114,566 | B2 | 2/2012 | Araki et al. |
| 8,685,624 | B2 | 4/2014 | Döttinger et al. |
| 8,808,968 | B2 | 8/2014 | Choi et al. |
| 9,789,679 | B2* | 10/2017 | Stebani ................. G03F 7/3057 |
| 10,175,580 | B2 | 1/2019 | Fronczkiewicz et al. |
| 10,518,571 | B2 | 12/2019 | Beyer et al. |
| 11,106,136 | B2* | 8/2021 | Mühlfeit ................... G03F 7/16 |
| 2011/0023739 | A1* | 2/2011 | Yoshimoto .............. G03F 7/202 101/395 |
| 2016/0054656 | A1 | 2/2016 | Bonney |
| 2017/0259607 | A1* | 9/2017 | Boukaftane ............. G03F 7/202 |

FOREIGN PATENT DOCUMENTS

| CA | 933792 A | 9/1973 |
| CN | 87100720 A | 8/1987 |
| DE | 1522444 A1 | 7/1969 |

(Continued)

OTHER PUBLICATIONS

International Search Report for PCT/EP2018/077096 dated Dec. 7, 2018.
Written Opinion of the International Searching Authority for PCT/EP2018/077096 dated Dec. 7, 2018.
Dietliker, Photoinitiators for free Radical and Cationic Polymerisation, Chemistry & Technology of UV & EB Formulation for Coatings, Inks and Paints, vol. 3, 1991.
F. D. Saeva, "Photoinduced electron transfer (PET) bond cleavage reactions", Topics in Current Chemistry, vol. 156, 1990, pp. 59-92.
G. G. Maslak, Topics in Current Chemistry, 168, 1993.

(Continued)

*Primary Examiner* — John S Chu
(74) *Attorney, Agent, or Firm* — Faegre Drinker Biddle & Reath LLP

(57) ABSTRACT

A digitally imageable, photopolymerizable relief precursor at least comprising, arranged one above another in the order stated,
 (A) a dimensionally stable carrier;
 (AH) optionally, an adhesion-promoting layer;
 (B) a relief-forming layer, at least comprising a crosslinkable elastomeric binder, a first ethylenically unsaturated monomer, and a photoinitiator;
 (C) at least one interlayer, at least comprising a first, non-radically crosslinkable elastic polymer;
 (D) a laser-ablatable mask layer, at least comprising a second, non-radically crosslinkable elastic polymer, a UVA light-absorbing material, and an IR light-absorbing material; and optionally
 (E) a removable cover layer;
characterized in that the layer (C) and optionally the layer (D) comprise at least one second ethylenically unsaturated monomer.

20 Claims, No Drawings

(56) References Cited

FOREIGN PATENT DOCUMENTS

| | | |
|---|---|---|
| DE | 1572136 B1 | 9/1969 |
| DE | 3045516 A1 | 7/1982 |
| EP | 0059988 A1 | 9/1982 |
| EP | 0079514 A2 | 5/1983 |
| EP | 0085472 A1 | 8/1983 |
| EP | 109772 A2 | 5/1984 |
| EP | 109773 A2 | 5/1984 |
| EP | 0224164 A2 | 6/1987 |
| EP | 0332070 A2 | 9/1989 |
| EP | 992849 A1 | 4/2000 |
| EP | 1170121 A1 | 1/2002 |
| EP | 1239329 A2 | 9/2002 |
| EP | 2279454 A1 | 2/2011 |
| EP | 3035123 A1 | 6/2016 |
| JP | S4537377 B1 | 11/1970 |
| JP | S4642363 B1 | 12/1971 |
| JP | S489005 U | 2/1973 |
| JP | S5753747 A | 3/1982 |
| JP | S59152396 A | 8/1984 |
| JP | S59174831 A | 10/1984 |
| JP | S61151197 A | 7/1986 |
| JP | S626223 A | 1/1987 |
| JP | S6341484 A | 2/1988 |
| JP | S6314340 B2 | 3/1988 |
| JP | 63-142345 | 6/1988 |
| JP | S63138345 A | 6/1988 |
| JP | S63142346 A | 6/1988 |
| JP | S63143537 A | 6/1988 |
| JP | H01152109 A | 6/1989 |
| JP | H01304453 A | 12/1989 |
| JP | H02249 A | 1/1990 |
| JP | H024705 A | 1/1990 |
| JP | 4486516 B2 | 6/2010 |
| WO | WO-2003062900 A1 | 7/2003 |
| WO | WO-2004015491 A1 | 2/2004 |
| WO | WO-2009141256 A1 | 11/2009 |
| WO | WO-2016188981 A1 | 12/2016 |

OTHER PUBLICATIONS

International Preliminary Report on Patentability received for PCT Patent Application No. PCT/EP2018/077096, dated Apr. 23, 2020, 15 pages (9 pages of English Translation and 6 pages of Original Document).
J. Brandrup, E.H. Immergut und E.A. Grulke, 4. Edition, Wiley-Interscience, 1999.
J. P. Faussier, Photoinitiated Polymerization-Theory and Applications: Rapra Review, vol. 9, 1998.
Monroe et al., "Photoinitiators for free-radical-initiated photoimaging systems", Chemical Reviews, vol. 93, 1993, pp. 435-448.
R. S. Davidson, Journal of Photochemistry and Biology A: Chemistry, vol. 73, 1993, pp. 81.
R.S. Davidson, Exploring the Science, technology and Applications of U.V. and E.B. Curing, Sita Technology LTD, London 1999.
Shuster et al., JAGS, 112, 1990, pp. 6329.
Tsunooka et al., 25 Prog. Polym. Sci., vol. 21, 1996.

* cited by examiner

RELIEF PRECURSOR HAVING LOW CUPPING AND FLUTING

CROSS-REFERENCE TO RELATED APPLICATIONS

This application is a national stage application (under 35 U.S.C. § 371) of PCT/EP2018/077096, filed Oct. 5, 2018, which claims benefit of European Application No. 17195719.4, filed Oct. 10, 2017, both of which are incorporated herein by reference in their entirety.

The invention relates to a relief precursor with which relief structures are obtained which exhibit unwanted effects such as cupping and/or fluting to a reduced degree. The relief precursor of the invention has an interlayer which comprises an elastic, non-radically crosslinkable polymer and an ethylenically unsaturated monomer.

Relief structures such as printing plates are used for printing a very wide variety of different substrates, such as paper, films, and card, with low-viscosity printing inks. The printing inks used are mostly polar printing inks based on water or on alcohol. Because of the printing process, printing plates are needed which are flexible, elastic, and resistant to polar printing inks.

Typical precursors for relief structures thereof comprise an elastomeric nonpolar binder, usually block copolymers based on styrene-isoprene or styrene-butadiene, in combination with monomers, plasticizer, and one or more photoinitiators (see, for example, U.S. Pat. No. 4,323,636). This radiation-sensitive layer is in general a few millimeters thick and is located on a dimensionally stable carrier, usually a PET film. The relief is generated by exposure with electromagnetic radiation through a mask film. On exposure, the exposed regions undergo crosslinking, whereas the unexposed regions of the precursor remain soluble or liquefiable and are removed by appropriate methods.

As an alternative to film exposure, relief structures may also be exposed through a laser-generated mask. The thin, ablatable mask layer is in this case located, with the so-called digital relief precursors, directly on the radiation-sensitive layer, as described in U.S. Pat. No. 5,262,275, for example. Imagewise ablation generates a mask through which exposure is subsequently carried out with electromagnetic radiation.

Regardless of whether the radiation-sensitive layer is exposed through a film or through a laser-generated integral mask, the relief must subsequently be generated by washout with suitable organic solvents; see, for example, EP 0 332 070.

On washout of the relief, there is also solvent swelling of the crosslinked regions of the relief structure. This solvent has to be removed again in a drying step. Because of the temperature sensitivity of the carrier film, the flexographic plates can be dried only at low temperatures.

There has consequently been no lack of attempts to develop relief structures which can be developed more rapidly. Hence printing plates may also be developed thermally; see, for example, EP 1 239 329 or EP 1 170 121. In this case, the relief structures are heated to the melting temperature following Imagine-wise exposure. The unexposed regions of the relief structure become partially liquid and tacky as a result, and are then removed continuously with a nonwoven or woven fabric which absorbs the liquid material.

Cupping is understood by the skilled person as the phenomenon in which measurable edges are formed at the borders of the image elements, especially at pixels. In EP 3 035 123 A1 a theory is formulated for the development of these elevated edges, whereby the diffusion of the crosslinker at the border between unexposed and exposed regions of the printing plate causes a significant transport of material, which substantially determines the shape of the screen dot and especially the edges of the screen dot. This screen dot shape results, on printing, in an uneven transfer of the printing ink to the print medium. At the extreme, rings are obtained rather than circles.

Fluting, also called the washboard effect, is an unwanted effect observed when printing to the outermost layer of corrugated card. Fluting is observed as the streaky appearance of alternating darker and lighter regions. The darker regions occur where the outermost layer and the corrugated inner ply are in contact. The fluting effect becomes strongly visible particularly when the areas being reproduced are not solid areas but rather tonal value regions with a low areal proportion. Experience suggests that this effect is particularly strongly pronounced with digitally imageable relief precursors.

It is an object of the invention to provide a relief precursor which results in less cupping and/or fluting and hence in better print outcomes.

Surprisingly it has been found that the cupping and fluting can be significantly reduced if the relief precursor comprises an interlayer which comprises a non-radically crosslinkable polymer and an ethylenically unsaturated monomer.

The object is achieved by means of a digitally imageable, photopolymerizable relief precursor at least comprising, arranged one above another in the order stated, (A) a dimensionally stable carrier;
(AH) optionally, an adhesion-promoting layer;
(B) a relief-forming layer, at least comprising a crosslinkable elastomeric binder, a first ethylenically unsaturated monomer, and a photoinitiator;
(C) at least one interlayer, at least comprising a first, non-radically crosslinkable elastic polymer;
(D) a laser-ablatable mask layer, at least comprising a second, non-radically crosslinkable elastic polymer, a UVA light-absorbing material, and an IR light-absorbing material; and optionally
(E) a removable cover layer;
characterized in that the layer (C) and optionally the layer (D) comprise at least one second ethylenically unsaturated monomer.

The dimensionally stable carriers (A) used may be dimensionally stable carrier materials, which may optionally have further layers. Examples of suitable dimensionally stable carriers are plates, films, and also conical and cylindrical sleeves made from metals such as steel, aluminum, copper or nickel, or from plastics such as polyethylene terephthalate, polybutylene terephthalate, polyamide, and polycarbonate, from wovens and nonwovens, such as woven glass fiber fabric, and from composite materials of glass fibers and plastics. Suitable dimensionally stable carriers include, in particular, dimensionally stable carrier films or metal sheets, examples being polyethylene or polyester films and steel or aluminum sheets. These carrier films or sheets are generally 50 to 1100 µm, preferably 75 to 400 µm, as for example around 250 µm thick. If a polymeric film is used, it has a thickness in the range from 100 to 200 µm, preferably from 125 to 175 µm. If steel is used as carrier material, steel sheets having a thickness of 0.05 to 0.3 mm are preferred. To protect against corrosion, preference is given to using tin-plated steel sheets. These carrier films or carrier sheets may be coated on the carrier film side facing the substrate layer with a thin, adhesion-promoting layer, this layer having a thickness, for example, of 0.05 to 5 µm. This adhesion layer may consist, for example, of a mixture of a polycarbonate, a phenoxy resin, and a polyfunctional isocyanate.

These carrier films or carrier sheets may already have been furnished with, or may be provided with, a thin adhesion-promoting layer (AH). Serving as adhesion vanish layers may be, for example, polyurethane adhesion varnishes, (e.g., according to DE3045516) based on polyisocyanate-crosslinked polyether or polyester varnishes, in layer thicknesses between 0.1 and 50 µm, more particularly between 2 and 30 µm.

Additional adhesion-promoting interlayers (AH) may be located on the side of the adhesion layer facing away from the carrier layer, and have layer thicknesses between 0.1 and 50, more particularly 1 and 10 µm, and may be obtained, for example, from diluted aqueous-alcoholic solution of partially (to an extent of 80 mol %, for example) saponified polyvinyl ester, phenyl glyceryl ether monoacrylate, and glyoxal, with drying and baking.

Adhesion promotion layers or interlayers are intended to increase the adhesion between individual layers and to stabilize the layer system. Materials to be selected in this context are those which are able to develop an interaction with respect to both layers. Preferred examples thereof are surfactants, amphiphilic molecules having hydrophobic and hydrophilic regions, and block copolymers, and oligomers containing blocks which are compatible with the two layers or compatible with the polymers in the layers.

The adhesion between the dimensionally stable carrier (A) and relief-forming layer (B) ought to be greater than 0.5 N/cm when measured in a peel test at a peel angle of 90° and a peeling rate of 30 mm/min.

The relief precursor comprises at least one photopolymerizable, relief-forming layer (B). The photopolymerizable, relief-forming layer may be applied directly on the carrier. Between the carrier and the relief-forming layer, however, there may also be other layers, such as adhesion layers or elastic or compressible sublayers, for example.

The relief-forming layer (B) may also consist of more than one layer, in which case it comprises in general 2 to 20 layers, preferably 2 to 5 layers, more preferably 2 to 3 layers, very preferably 2 layers. The layers may comprise the same constituents or different constituents, in identical or different proportions. Preferably these layers contain the same constituents. The relief-forming layers closest to the carrier layer are preferably already fixed, crosslinked and/or reacted. Arranged on these fixed, crosslinked, reacted layers is at least one relief-forming layer, which may also be fixed, crosslinked or reacted.

Elastomeric binders for producing relief-forming layers of flexographic printing elements are known to the skilled person. Examples include styrene-diene block copolymers, natural rubber, polybutadiene, polyisoprene, styrene-butadiene rubber, nitrile butadiene rubber, butyl rubber, styrene-isoprene rubber, styrene-butadiene-isoprene rubber, polynorbornene rubber, or ethylene-propylene-diene rubber (EPDM). Hydrophobic binders are used with preference. Such binders are soluble in organic solvents or mixtures thereof.

The elastomer is preferably a thermoplastically elastomeric block copolymer of alkenyl aromatics and 1,3-dienes. The block copolymers may be linear, branched or radial block copolymers. Customarily they are triblock copolymers of A-B-A type, but may alternatively be diblock polymers of A-B type, or those having a plurality of alternating elastomeric and thermoplastic blocks, e.g., A-B-A-B-A. Mixtures of two or more different block copolymers may also be used.

Commercially customary triblock copolymers frequently include certain fractions of diblock copolymers. The diene units may be 1,2- or 1,4-linked. Block copolymers of the styrene-butadiene or styrene-isoprene type and also of the styrene-butadiene-isoprene type may all be used. They are available commercially under the name Kraton®, for example. Furthermore, it is also possible to use thermoplastically elastomeric block copolymers having end blocks of styrene and a statistical styrene-butadiene middle block. The block copolymers may also be wholly or partly hydrogenated, such as in SEBS rubbers, for example. Preferred elastomeric binders are triblock copolymers of A-B-A type or radial block copolymers of (AB)n type, in which A is styrene and B is a diene, and also statistical copolymers and random copolymers of styrene and a diene.

In one preferred embodiment of the invention, the thermoplastically elastomeric binders comprise at least one styrene-isoprene block copolymer, more particularly styrene-isoprene-styrene block copolymers, where the polymers may also include fractions of diblock styrene-isoprene copolymers. Preferred binders of the styrene-isoprene type contain generally 10 to 30 wt %, preferably 12 to 28 wt %, and more preferably from 14 to 25 wt % of styrene. These block copolymers customarily have an average molecular weight Mw (weight average) of 100 000 to 300 000 g/mol. Mixtures of different styrene-isoprene block copolymers may of course also be used. In a second embodiment of the invention, it is possible to use preferably radial isoprene-styrene block copolymers. The isoprene units in the polyisoprene blocks may be 1,4-linked, meaning that the remaining double bond is disposed in the chain, or 3,4-linked, meaning that the remaining double bond is arranged pendantly. Block copolymers can be used which have substantially 1,4-linkages, and binders which have certain proportions of 3,4-linkages. The pendant vinyl groups in binders with 3,4-linked isoprene units may undergo preferential reaction in the course of the crosslinking of the photopolymerizable layer and may consequently result in a plate with high crosslinking. For example, styrene-isoprene block copolymers can be used which have a vinyl group content of 20 to 70%.

In one preferred embodiment of the invention, a radial styrene-isoprene copolymer can be used which has a vinyl group fraction of less than 10%. In a second preferred embodiment of the invention, a mixture of two different styrene-isoprene block copolymers is employed. In this case, preferably, one of them has a vinyl group content of at least 20%, more particularly 20 to 70%, preferably 25 to 45%. The other may have a low vinyl group content of less than 10%, for example. With further preference it is possible to use a mixture of two styrene-isoprene copolymers of which one has a high diblock fraction of more than 40 wt % and the second has a lower diblock fraction of less than 30 wt %. Besides the stated thermoplastically elastomeric block copolymers, especially the styrene-isoprene block copolymers, the photopolymerizable layer may also comprise further elastomeric binders other than the block copolymers. Using such additional binders, also called secondary binders, it is possible to modify the properties of the photopolymerizable layer. One example of a secondary binder are vinyltoluene-α-methylstyrene copolymers. Generally speaking, the amount of such secondary binders ought not to exceed 25 wt %, based on the total amount of all the binders used. Preferably the amount of such secondary binders does not exceed 15 wt %, more preferably not 10 wt %. The total amount of binders is customarily 30 to 90 wt %, based on the total of all constituents of the relief-forming layer, preferably 40 to 85 wt %, and more preferably 60 to 85 wt %.

In the case of aqueously developable relief precursors, the polymers used are emulsifiable, dispersible, swellable, or soluble in water. As well as fully or partly hydrolyzed polyvinyl acetates it is possible to use polyvinyl alcohols, polyvinyl acetals, polystyrenesulfonates, polyurethanes, polyamides (as described in EP 0 085 472 or in DE 1522444, for example), and any desired combinations thereof. Examples of polymers of these kinds can be found in EP 0 079 514, EP 0 224 164, or EP 0 059 988. These polymers may be linear, branched, star-shaped or dendritic and may take the form of a homopolymer, statistical copolymers, block copolymers or alternating copolymers. Very often the stated polymers carry functional groups which may either raise the solubility and/or participate in crosslinking reactions. These groups include, for example, carboxyl, $SO_3$, OH, thiol, ethylenically unsaturated, (meth)acrylate, and epoxide groups, and any combinations thereof.

The total amount of elastomeric binders in the case of the relief-forming layer (B) is customarily 30 to 90 wt %, based on the sum total of all the constituents of the relief-forming layer, preferably 40 to 85 wt %, and more preferably 45 to 85 wt %.

The relief-forming layer (B) may comprise further constituents, selected from the group consisting of plasticizers, solvents, further binders, colorants, stabilizers, regulators, UV absorbers, dispersing assistants, a crosslinker, viscosity modifiers, surface-active substances, and any combinations thereof. These additives or auxiliaries and adjuvants are present in the radiation-sensitive mixture in a total concentration in the range from 0.001 to 60 wt %, based on the overall formulation, preferably in the range from 0.01 to 50 wt %, particularly in the range from 0.1 to 50 wt %, especially in the range from 1 to 50 wt %. The individual additives are present in concentrations of 0.001 to 40 wt %, based on the overall formulation, preferably in the range from 0.01 to 40 wt %, particularly in the range from 0.1 to 40 wt %, especially in the range from 0.1 to 35 wt %.

The photopolymerizable, relief-forming layer (B) further comprises, conventionally, at least one first ethylenically unsaturated monomer which is compatible with the binder or binders. The first ethylenically unsaturated monomer may also comprise mixtures of two or more different monomers. Suitable compounds have at least one olefinic double bond and are polymerizable. They are therefore referred to below as monomers. Having proven particularly advantageous are esters or amides of acrylic acid or methacrylic acid with mono- or polyfunctional alcohols, amines, amino alcohols or hydroxyethers and hydoxyesters, esters of fumaric or maleic acid, vinyl ethers, vinyl esters, and allyl compounds.

In general these monomers are compounds which are not gaseous at room temperature.

The first ethylenically unsaturated monomer preferably contains at least 2 ethylenically unsaturated groups, more preferably 2 to 6 ethylenically unsaturated groups, very preferably 2 or more ethylenically unsaturated groups. Compounds having C—C triple bonds may also be used in the radiation-sensitive mixture. The ethylenically unsaturated group is preferably at least one acrylate and/or methacrylate group, although styrene derivatives, acrylamides, vinyl esters, and vinyl ethers can also be employed. The ethylenically unsaturated monomer has a molecular weight of in general less than 600 g/mol, preferably less than 450 g/mol, more preferably less than 400 g/mol, very preferably less than 350 g/mol, and more particularly less than 300 g/mol.

Particularly suitable are derivatives of acrylic and/or methacrylic acid, such as the esters thereof with mono- or polyhydric alcohols, examples being acrylic or methacrylic esters of alkanols having 1 to 20 carbon atoms, such as methyl methacrylate, ethyl acrylate, propyl (meth)acrylate, isopropyl (meth)acrylate, n-butyl (meth)acrylate, isobutyl (meth)acrylate, tert-butyl (meth)acrylate, hexyl (meth)acrylate, cyclohexyl (meth)acrylate, 2-ethylhexyl (meth)acrylate, lauryl (meth)acrylate, (meth)acrylic esters of polyhydric alcohols having 2 to 20 carbon atoms, e.g., 2-hydroxyethyl (meth)acrylate, 2-hydroxypropyl (meth) acrylate, ethylene glycol di(meth)acrylate, polyethylene glycol di(meth)acrylate, butane-1,4 diol di(meth)acrylate, neopentyl glycol di(meth)acrylate, 3-methylpentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di-, tri-, and tetraethylene glycol di(meth)acrylate, tripropylene glycol di(meth)acrylate or pentaerythritol tetra(meth) acrylate, and also poly(ethylene oxide) di(meth)acrylate, m-methyl-poly(ethylene oxid)yl (meth)acrylate, N,N-diethylaminoethyl acrylate, a reaction product of 1 mol of glycerol, 1 mol of epichlorohydrin, and 3 mol of acrylic acid, and also glycidyl methacylate and bisphenol A diglycidyl ether acrylate.

Also suitable are derivatives of acrylamide and of methacrylamide, such as, for example, ethers of their N-methylol derivates with mono- and polyhydric alcohols, examples being ethylene glycol, glycerol, 1,1,1-trimethylolpropane, oligomeric or polymeric ethylene oxide derivatives. These are especially suitable if polyamides or polyvinyl alcohol are used as binders.

Also suitable are what are called epoxy and urethane (meth)acrylates, of the kind obtainable, for example, by reaction of bisphenol A diglycidyl ether with (meth)acrylic acid or by reaction of diisocyanates with hydroxyalkyl (meth)acrylates or with hydroxyl-containing polyesters or polyethers. Additionally employable olefinically unsaturated compounds are esters of acrylic or methacrylic acid, especially those with a low vapor pressure and those modified with compatibilizers, e.g., with hydroxyl, amido, sulfoester or sulfonamide groups. Mixtures of the above-stated copolymerizable ethylenically unsaturated organic compounds may also be used.

Preferred first ethylenically unsaturated monomers are butane-1,4-diol di(meth)acrylate, neopentyl glycol di(meth) acrylate, 3-methylpentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di-, tri-, and tetraethylene glycol di(meth)acrylate, tripropylene glycol di(meth)acrylate, and pentaerythritol tetra(meth)acrylate.

In one embodiment the first ethylenically unsaturated monomer is present in a concentration in the range from 0.5 to 60 wt %, based on the overall formulation, preferably in the range from 1 to 50 wt %, more preferably in the range from 1 to 40 wt %, very preferably in the range from 2 to 40 wt %.

The relief-forming layer (B) further comprises one or more initiators or initiator systems comprising at least 2 components, which on irradiation with electromagnetic radiation generate radicals which bring about polymerization and/or crosslinking. Such initiators are known to the skilled person and described for example in the following references: Bruce M. Monroe et al., Chemical Review, 93, 435 (1993), R. S. Davidson, Journal of Photochemistry and Biology A: Chemistry, 73, 81 (1993), J. P. Faussier, Photoinitiated Polymerization-Theory and Applications: Rapra Review, Vol. 9, Report, RapraTechnology (1998), M. Tsunooka et al., 25 Prog. Polym. Sci., 21, 1 (1996), F. D. Saeva, Topics in Current Chemistry, 1 56, 59 (1990), G. G. Maslak, Topics in Current Chemistry, 168, 1 (1993), H. B. Shuster et al., JAGS, 112, 6329 (1990) and I. D. F. Eaton et al., JAGS, 102, 3298 (1980), P. Fouassier and J. F. Rabek, Radiation Curing in Polymer Science and Technology, pages 77 to 117 (1993) or K. K. Dietliker, Photoinitiators for free Radical and Cationic Polymerisation, Chemistry & Technology of UV & EB Formulation for Coatings, Inks and Paints, Volume 3, Sita Technology LTD, London 1991; or R. S. Davidson, Exploring the Science, technology and Applications of U.V. and E.B. Curing, Sita Technology LTD, London 1999. Further initiators are described in JP45-37377, JP44-86516, U.S. Pat. Nos. 3,567,453, 4,343,891, EP109772, EP109773, JP63138345, JP63142345, JP63142346, JP63143537, JP4642363, JP59152396, JP61151197, JP6341484, JP2249 and JP24705, JP626223, JPB6314340, JP1559174831, JP1304453, and JP1152109.

Preferred are initiators or initiator systems which come from the group of the initiators generally of Norrish type I or Norrish type II, which are based on H abstraction or electron transfer. The Norrish type I initiators include, for example, benzoyl radical-forming initiators, α-hydroxy ketones, α-amino ketones, acylphosphine oxides, bisacylphosphine oxides, triazines, and hexaarylbisimidazoles, which may additionally be combined with dyes or sensitizers in order to raise the sensitivity. The Norrish type II initiators are, in particular, combinations of ketones or aldehydes with H-transfer agents such as amines or thiols, for example. The initiators are preferably selected from the group consisting of benzil dimethyl ketal, diphenyl(2,4,6-trimethylbenzoyl)phosphine oxides, 2,4,6-trimethyl-benzoylphenylphosphinates; bis(2,4,6-trimethylbenzoyl)phenylphosphine oxides, bis(2,6-dimethoxybenzoyl)-2,1,4-trimethylpentylphosphine oxides, Michler's ketone, benzophenone alone and/or combined with sensitizers, amines or thiols, and any combinations thereof. Further initiators which can be employed are onium salts, organic peroxides, thio compounds, ketoximes, borates, coumarins, ketocoumarins, azinium and azo compounds, metallocenes, and compounds having a carbon-halogen group, which may likewise be used in combination or together with sensitizers, amines or thiols. The sensitizers which can be used are, for example, xanthones, thioxanthones, anthracenes, perylenes, phenothiazines, benzophenones, acetophenones, coumarins, ketocoumarins, and dyes. A prerequisite for sensitization is either that the triplet energy of the sensitizer is higher than that of the initiator to be sensitized, or that there is the possibility of electron transfer from an excited state of the sensitizer.

In general the relief-forming layer, according to one preceding embodiment, comprises the initiator or the initiator system in a concentration in the range from 0.1 to 20 wt %, based on the overall formulation. Preferred initiator concentrations are in the range from 1 to 10 wt %, more preferably in the range from 1 to 8 wt %, very preferably in the range from 1 to 6 wt %.

The relief-forming layer (B) may comprise plasticizers. Mixtures of different plasticizers may also be used. Examples of suitable plasticizers encompass modified and unmodified natural oils and natural resins, such as high-boiling paraffinic, naphthenic or aromatic mineral oils, synthetic oligomers or resins such as oligostyrene, high-boiling esters, oligomeric styrene-butadiene copolymers, oligomeric alpha-methylstyrene/p-methylstyrene copolymers, liquid oligobutadienes, especially those having a molecular weight of 500 to 5000 g/mol, or liquid oligomeric acrylonitrile-butadiene copolymers or oligomeric ethylene-propylene-diene copolymers. Preference is given to polybutadiene oils (liquid oligobutadienes), especially those having a molecular weight of 500 to 5000 g/mol, high-boiling aliphatic esters such as, in particular, alkyl esters of monocarboxylic and dicarboxylic acids, examples being stearates or adipates and mineral oils. Particularly preferred are high-boiling, substantially paraffinic and/or naphthenic mineral oils. It is possible, for example, to use what are called paraffin-base solvates and specialty oils. With mineral oils, the skilled person distinguishes between technical white oils, which may also include a very small aromatic content, and medical white oils, which are substantially free from aromatics. They are commercially available and equally well-suited. Particularly widespread as plasticizers are white oils or oligomeric plasticizers, such as, in particular, polybutadiene oils, carboxylic esters, phthalates. In this regard, reference may be made by way of example to EP 992 849 and EP 2 279 454. The amount of a plasticizer optionally present is determined by the skilled person according to the desired properties of the layer. As a general rule it will not exceed 60 wt % of the sum total of all the constituents of the photopolymerizable, relief-forming layer (B), and in general it is 0 to 60 wt %, preferably 0 to 50 wt %.

The relief-forming layer (B) may additionally comprise other functional additions, as described in U.S. Pat. No. 8,808,968, for example, small amounts of phosphites, phosphines, thioethers, and of amino-functional compounds. This makes it possible to negate or minimize the disruptive influence of oxygen, which is also present in the layer or enters by diffusion, and to obtain an even higher resolution.

The relief-forming layer (B) may, in further embodiments, comprise further constituents, selected from the group consisting of solvents, stabilizers, dyes, pigments, additives, surface-active substances, UV absorbers, regulators, plasticizers, binders, and any combinations thereof.

The relief-forming layer (B) may further comprise interface-active substances such as hydrophobic waxes or siliconized or perfluorinated compounds, as described in U.S. Pat. No. 8,114,566. These substances, during the drying of the flexographic printing plate, migrate from the relief layer to the surface, act to repel the printing ink, and, in the printing process, cause reduced fouling of fine halftones and reduce the frequency with which the printing plates have to be cleaned.

In the radiation-sensitive mixture of the relief-forming layer (B) there may also be inhibitors with respect to thermal polymerization, which exhibit not significant absorption of their own in the actinic range in which the photoinitiator absorbs, such as, for example, 2,6-di-tert-butyl-p-cresol, hydroquinone, p-methoxyphenol, β-naphthol, phenothiazine, pyridine, nitrobenzene, m-dinitrobenzene or chloranil; thiazine dyes, such as thionine blue G (CI 52025), methylene blue B (C.I. 52015) or toluidine blue (CA. 52040); or N-nitrosamines, such as N-nitrosodiphenylamine, or the salts, for example the potassium, calcium or aluminum salts, of N-nitrosocyclohexylhydroxylamine. It is also possible, furthermore, to use other inhibitors or stabilizers, as described for example in A. Valet, Lichtschutzmittel für Lacke, 33ff, Vincentz Verlag Hannover 1996, especially sterically hindered phenols and amines.

Suitable colorants as well, such as dyes, pigments or photochromic additions, may be present in the radiation-sensitive mixture of the relief-forming layer (B), in an amount of 0.0001 to 2 wt %, based on the mixture. They serve to control the exposure properties, as regulators, for identification, for direct control of the exposure outcome, or esthetic purposes. A prerequisite for the selection and the amount of such additions is that they have as little disruptive effect as the inhibitors of thermally initiated polymerization on the photopolymerization of the mixtures. Suitable, for example, are the soluble phenazinium, phenoxazinium, acridinium, and phenothiazinium dyes, such as neutral red (CI 50040), safranin T (CA. 50240), rhodanil blue, the salt and/or amide of rhodamine D (basic violet 10, C.I. 45170), methylene blue B (C.I. 52015), thionine blue G (C.I. 52025), or acridine orange (CA. 46005); and also solvent black 3 (C.I. 26150). These dyes may also be used together with a sufficient amount of a reducing agent which does not reduce the dye in the absence of actinic light but on exposure is able to reduce the dye in the excited electronic state. Examples of such mild reducing agents are ascorbic acid, anethole, thiourea, e.g., diethylallylthiourea, especially N-allylthiourea, and also hydroxyl amine derivatives, especially salts of N-nitrosocyclohexylhydroxylamine, preferably the potassium, calcium, and aluminum salts. The latter may serve, as mentioned, as inhibitors of thermally initiated polymerization as well. The reducing agents may be added in general in amounts of 0.005 to 5 wt %, based on the mixture, and in many cases the addition of from 3 to 10 times the amount of dye alongside which it is used has been found appropriate.

UV absorbers in the relief-forming layer (B) may likewise have advantages and may positively influence the formation of the relief. Compounds suitable as UV absorbers are described for example in A. Valet, Lichtschutzmittel für Lacke, 20ff, Vincentz Verlag Hannover 1996. Examples are hydroxyphenylbenzotriazoles, hydroxybenzophenones, hydroxyphenyl-s-triazines, oxalanilides, hydroxyphenylpyrimidines, salicylic acid derivatives, and cyanoacrylates, and any combinations thereof.

The surface-active substances include compounds which in a particular composition attempt to accumulate at the surface of the composition. These include, in particular, surfactants, amphiphilic molecules having hydrophobic and hydrophilic regions, and block copolymers and oligomers containing blocks which have a relatively low surface energy. It is, however, also possible to employ substances of low to high molecular weight which are incompatible with the formulation and/or migrate to the surface on account of their particularly low surface energy, examples being waxes, silicones, silanes, and fluorinated compounds. Preference is given to using waxes, such as paraffin waxes, polyethylene waxes, polypropylene waxes, for example, and any desired mixtures thereof. In one preferred embodiment the relief-forming layer (B) comprises at least one wax in a concentration in the range from 0.1 to 10 wt %, based on the total mass of the relief-forming layer (B). The wax concentration is preferably in the range from 0.2 to 5 wt %, more preferably in the range from 0.5 to 5 wt %, very preferably in the range from 0.5 to 4 wt %.

These surface-active substances, and especially the waxes, may develop an effect as a mobile barrier layer for oxygen. As a result, oxygen-inhibited fixation reactions are quicker, and the detail accuracy is greater. An advantage when using relatively low-molecular-weight waxes and surface-active substances is that they always tend to migrate to the freshly generated surface. Preferably they are used with elastomeric binders such as, for example, styrene-butadiene rubbers, nitrile-butadiene rubbers, butyl rubbers, styrene-isoprene rubbers, styrene-butadiene-isoprene rubbers, and waxes such as paraffin waxes, polyethylene waxes or polypropylene waxes, for example.

The thickness of the relief-forming layer (B) is generally 0.1 to 7 mm, preferably 0.5 to 4 mm, more preferably 0.7 to 3 mm, and very preferably 0.7 to 2.5 mm. In certain cases the layer thickness is preferably from 2 to 7 mm, more preferably from 2.5 to 7 mm, and very preferably from 2.8 to 7 mm.

The layer thickness S of the interlayer (C) of the invention is generally 0.1 to 30 µm, preferably 0.5 to 25 µm, more preferably 0.7 to 20 µm, and very preferably 0.7 to 15 µm.

The interlayer (C) of the invention comprises at least one first elastic polymer and also at least one second ethylenically unsaturated monomer which preferably carries at least two ethylenically unsaturated groups. The second ethylenically unsaturated monomer may be the same as or different from the first ethylenically unsaturated monomer. Mixtures of two or more different ethylenically unsaturated monomers are possible. With preference the first and second ethylenically unsaturated monomers are the same ethylenically unsaturated monomer or the same mixture of two or more ethylenically unsaturated monomers. As second ethylenically unsaturated monomer, suitability is therefore possessed by all ethylenically unsaturated monomers identified above as first ethylenically unsaturated monomers.

Preferred second ethylenically unsaturated monomers are butane-1,4-diol di(meth)acrylate, neopentyl glycol di(meth)acrylate, 3-methylpentanediol di(meth)acrylate, 1,1,1-trimethylolpropane tri(meth)acrylate, 1,4-butanediol diacrylate, 1,6-hexanediol diacrylate, 1,6-hexanediol dimethacrylate, 1,9-nonanediol diacrylate, di-, tri-, and tetraethylene glycol di(meth)acrylate, tripropylene glycoldi(meth)acrylate, and pentaerythritol tetra(meth)acrylate.

In one embodiment the second ethylenically unsaturated monomer is present in the interlayer (C) in a concentration K which is equal to or lower than the concentration of the first ethylenically unsaturated monomer in layer (B). More preferably K is lower than the concentration of the first ethylenically unsaturated monomer in layer (B). Additionally, the concentrations of the first ethylenically unsaturated monomer in layer (B) and the concentrations of the second ethylenically unsaturated monomer in interlayer (C) differ by ±2 wt %, based in each case on the total mass of the layer (B) or (C), respectively, preferably by ±1.5 wt %, more preferably by ±1 wt %. The second ethylenically unsaturated monomer in the interlayer (C) is present in general in a concentration K of 0.1 to 25 wt %, preferably in the range from 0.2 to 20 wt %, more preferably in the range from 0.2 to 15 wt %, and very preferably in the range from 0.2 to 10 wt %, based on the total weight of the interlayer (C).

The concentration of the second ethylenically unsaturated monomer in the layers may be determined by all the analytical techniques known to the skilled person. For this purpose it may be advantageous to detach the individual layers and to investigate the resultant solutions. This can be done using, for example, gas chromatography (optionally coupled with mass spectroscopy). Another technique analyzes the layers without the use of solvent, by means of secondary ion mass spectrometry (SIMS or ToF SIMS).

It has proven advantageous if the ratio of the layer thickness S in µm to the concentration K in wt % is in the range from 30:0.1 to 0.1:25 µm/wt %, preferably in the range from 25:0.2 to 0.5:20 µm/wt %, more preferably in the range from 20:0.2 to 0.7:15 µm/wt %.

The interlayer (C) may be a transparent layer, to ensure exposure of the relief-forming layer (B). For transparency measurement, the layer constituents are dissolved in a suitable solvent mixture and the solution is drawn down onto a transparent PET film (125 µm thickness). The assembly is subsequently dried in a drying cabinet at 110° C. for 30 minutes. The transparency measurement can be carried out using a UV-VIS spectrometer Varian Cary 50 Conc with the Cary Win UV software in version 2.00(25), with subtraction of the transparency of the PET film without layer as a reference/baseline. Measurement takes place in the range from 500 to 350 µm. The transparency of an interlayer (C) 3 to 5 µm thick in the region of actinic radiation (350-500 nm) ought to be in the range from 40 to 100%, preferably in the range from 60 to 100%, more preferably in the range from 65 to 100%.

The interlayer (C) may be permeable or impermeable to oxygen. In a further embodiment the interlayer (C) is impermeable to oxygen. This reduces or entirely suppresses the inhibition of the radical chain reaction caused by subsequent diffusion of oxygen. As a result, halftone dots have a flat surface. In an embodiment in which the interlayer (C) is permeable to oxygen, in contrast, halftone dots with a rounded-off surface tend to be produced. This may be advantageous under certain conditions.

If the interlayer (C) is impermeable to oxygen, the polymers used as first elastic polymer are those having an oxygen permeability of less than or equal to $1.5*10^5$ cm$^3$*µm/(m$^2$*d*bar). The oxygen permeability is determined by the carrier gas technique in accordance with ASTM D3985 using instruments from Mocon Inc. with a coulometric sensor at 23° C. and 0% relative humidity. These samples are measured free-standing, the measuring area being 5 cm$^2$ or 10 cm$^2$ and the sample thickness being between 75 and 108 µm. If the interlayer (C) is permeable to oxygen, the polymers used as first elastic polymer are those which have an oxygen permeability of greater than $1.5*10^5$ cm$^3$*µm/(m$^2$*d*bar).

The architecture of the first elastic polymer is such that it carries no groups which can lead to crosslinking in a radical reaction. This ensures that the removal of the interlayer using solvents or by melting and subsequent adsorption on a development material is as far as possible complete. The first elastic polymer may be a linear, branched, star-shaped, comb-shaped, or dendritic homo- or copolymer. Copolymers may take the form of statistical and/or block copolymers. The first elastic polymer may also be a mixture of different polymers, differing, for example, in structure, monomer composition, block lengths, molecular weights, functional groups, their number and/or distribution.

In a further embodiment, the first elastic, non-radically crosslinkable polymer has a δ solubility parameter of 15 to 27 (MPa)$^{1/2}$, to allow the second ethylenically unsaturated monomer to be dissolved in sufficient quantity. The elastic, non-radically crosslinkable polymer preferably has a δ solubility parameter of 17 to 27 (MPa)$^{1/2}$, very preferably a δ solubility parameter of 19 to 27 (MPa)$^{1/2}$. Solubility parameters comprise three factors: the energy from forces of dispersion between molecules, the energy from dipolar-intermolecular forces between the molecules, and the energy of hydrogen bonds between the molecules. These three parameters may be treated as coordinates for a point in three dimensions, also known as the Hansen space. For polymers, the solubility parameter is determined empirically from dissolution tests in different solvents. The values for certain polymers are listed in the Polymer Handbook by J. Brandrup, E. H. Immergut and E. A. Grulke, 4th edition, Wiley-Interscience, 1999.

Suitable first elastic polymers have a softening or melting point below 230° C., preferably below 180° C., and more preferably below 160° C.

Examples of suitable first elastic polymers which can be developed thermally and/or are soluble in organic solvents and which possess a sufficient barrier effect toward oxygen are partially hydrolyzed polyvinyl acetates having a degree of hydrolysis of 30 up to a maximum of 80 mol %, ethylene-vinyl acetate copolymers and ethylene-vinyl alcohol copolymers, and ethylene-vinyl acetate-vinyl alcohol copolymers. Also highly suitable are cyclic acetals of polyvinyl alcohol such as polyvinyl butyral, polyvinyl ethyral, polyvinyl formal, polyvinyl propyral, and also copolymers containing two or more different vinyl acetal units selected from vinyl formal, vinyl ethyral, vinyl propyral, and vinyl butyral units. The polyvinyl acetals are always copolymers with vinyl alcohol units, since the reaction of polyvinyl alcohol to the full acetal is incomplete for statistical and steric reasons. To be exact, therefore, poly(vinylbutyral) is a poly(vinylbutyral-vinyl alcohol). The residual OH content of the stated polyvinyl acetals is customarily between 10 and 30 wt %. Highly suitable, for example, are vinyl ethyral-vinyl butyral-vinyl alcohol copolymers (poly(vinyl ethyral-vinyl butyral)).

Suitable first elastic polymers which can be developed thermally and/or are soluble in water and/or organic solvents and which possess little or no oxygen barrier effect are, for example, ethylene-vinyl acetates, flexibly elastic polyamides, polyvinyl chlorides, polyesters, flexibly elastic polyurethanes, nitrocelluloses, modified polyolefins, and any combinations thereof. Flexibly elastic polyamides comprise long-chain, difunctional fatty acids as monomeric units, giving the polyamide flexibly elastic properties. Especially suitable is Makromelt® 6900 (Henkel A G). Likewise suitable are styrene-diene block copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber, or ethylene-propylene-diene rubber (EPDM), especially after hydrogenation.

In one embodiment the interlayer (C) comprises the first non-radically crosslinkable, elastic polymer in a concentration of 60 to 99 wt %, preferably in the range from 70 to 99 wt %, more preferably in the range from 80 to 99 wt %.

In an additional embodiment, the interlayer (C) comprises particles having a particle size of 0.2 to 30 µm, preferably in the range from 0.3 to 20 µm, more preferably in the range from 0.5 to 15 µm, very preferably in the range from 1 to 10 µm. The particle size distribution in this case may be very broad, but preferably is narrow. The particles may result in structuring of the surface of the relief-forming layer (B), where they may give rise to roughness and an increase in the surface area, which proves advantageous in the context of ink transfer. This structuring may be accomplished by modeling of the particles and also by permanent attachment of the particles to the surface of the relief-forming layer (B).

The particles may be inorganic or organic particles, or mixed inorganic-organic particles. The particles may be in amorphous, crystalline or semicrystalline form. They may be round and regular, or else irregular. The shape of the particles may be symmetrical, as for crystalline materials. They may be hollow, porous or compact, and core-shell structures or onionlike structures can be used.

Suitable particles include inorganic fillers, such as silicates, quartz flours, glass particles, silicon oxides or aluminum oxides or titanium oxides, or else natural minerals such as, for example, hydroxyapatite, talc, calcium sulfate or calcium carbonate, or pigments such as iron oxides or chromium oxides, for example. The particles may have been surface-treated or surface-functionalized in order to ensure uniform dispersing of the particles in the interlayer (C). Preference is given to using silicates or silicon dioxides.

In one specific embodiment it is also possible to use particles of organic materials such as polyethylene, polycarbonates, and poly(meth)acrylates. The particles may be crosslinked or noncrosslinked and may also be functionalized with organic functional groups. If using organic particles it is advantageous if these materials do not dissolve in the composition employed for producing the layer, or are incompatible with the polymers used therein, so that discrete phases and particles are formed.

Depending on the surface functionality of the particles in question, the process of modeling of the topography of the barrier layer (C) onto the relief-forming layer (B) may be different. If, for example, a particle is functionalized on the surface with ethylenically unsaturated groups, then the particles, under areal UVA exposure, react with the crosslinkable constituents of the relief-forming layer. As a consequence of this, the particle is transferred into the relief-forming layer and then projects from the surface. Unfunctionalized particles, on the other hand, are usually removed, but leave indentations behind in the surface.

Furthermore, the particles may also be swollen/loaded with monomer beforehand, and this may lead to fixation of the particles on the surface of the layer (B). In this way, moreover, ethylenically unsaturated monomer can be introduced into the interlayer (C).

In order not to exert too strong an influence on the transparency of the interlayer (C), the particles used ought to have a refractive index similar to that of the polymers used in the interlayer (C). In general the refractive indices ought not to differ by more than ±0.09, preferably not more than ±0.06, more preferably not more than ±0.05, and very preferably not more than ±0.04.

The interlayer (C) may comprise the particles in a concentration of 0.5 to 35 wt %, preferably in the range from 1 to 25 wt %, more preferably in the range from 1.5 to 20 wt %.

The interlayer (C) may comprise further constituents, which facilitate the processing of the layer or give it additional properties. The further constituents may for example be additives, stabilizers, adhesion promoters, defoamers, surface-active substances, emulsifiers, dispersants, waxes, and dyes. Suitable adhesion promoters in this context are, in particular, oligomers, polymers and block copolymers, and statistical copolymers, having an affinity to adjacent layers. Basic adhesion components in particular may be used if the adjacent layers have acidic functions, and vice versa. Also possible is the use of ionic polymers, in which case one of the adjacent layers comprises cationic polymers and the other layer comprises anionic polymers.

A further quality of the interlayer (C) is that during the imaging of the mask layer (D) the interlayer is predominantly not removed, but instead remains on the relief-forming layer. Consequently, there is no use of materials and substances which absorb electromagnetic radiation used in the ablation, are highly volatile, decompose on heating and/or generate gases, or promote the ablation.

The relief precursor of the invention comprises a laser-ablatable mask layer (D) which is arranged over the interlayer (C) and which, moreover, can be removed with solvents or by heating and adsorption/absorption. This layer, by selective irradiation using high-energy electromagnetic radiation, is heated and volatized, so generating a mask with imagewise structuring which is utilized for transferring the structure to the relief precursor. For this purpose the layer must be impermeable in the UV range and must absorb radiation in the VIS-IR range, leading to the heating of the layer and its ablation.

The optical density of the mask layer in the UV range from 330 to 420 nm here is in the range from 1 to 5, preferably in the range from 1.5 to 4, more preferably in the range from 2 to 4. The optical density is determined by measurement with an X-rite 361TX densitometer in the "density" setting with UV filter.

The optical density of the mask layer in the VIS-IR range from 340 to 660 nm, OD(VIS IR), is in the range from 1 to 5, preferably in the range from 1.5 to 4, more preferably in the range from 2 to 4. The optical density is determined by measurement with an X-rite 361TX densitometer in the "density" setting.

The layer thickness M of the laser-ablatable mask layer (D) is generally 0.1 μm to 5 μm. At layer thickness below 0.1 μm it is difficult to achieve a sufficient optical density. At layer thicknesses of more than 5 μm, the laser sensitivity of the element is too low, and so long laser times are needed for imaging. Preferably the layer thickness is 0.3 μm to 4 μm, more preferably 1 μm to 3 μm. The laser sensitivity of the mask layer (measured as the energy needed to ablate 1 cm$^2$ of layer) ought to be between 0.1 and 10 mJ/cm$^2$, preferably between 0.3 and 5 mJ/cm$^2$, more preferably between 0.5 and 5 mJ/cm$^2$.

The mask layer (D) may optionally also comprise the second ethylenically unsaturated monomer. It is also possible, optionally, for there to be at least one further monomer present in the mask layer, different from the first and second ethylenically unsaturated monomers. Subject to the proviso that the ethylenically unsaturated monomers are soluble in the layers (A, AH, B, C, D, E, and F) and possess a sufficiently high diffusion rate, they can be present in all the layers.

The mask layer (D) comprises at least one second, non-radically crosslinkable elastic polymer which is capable of uniformly distributing the components which absorb the electromagnetic radiation, and which on heating is ablated with maximum efficiency. The second elastic polymer may be the same polymer as the first elastic polymer, or a different polymer. The second elastic polymer may be a linear, branched, star-shaped, comb-shaped, or dendritic homopolymer or copolymer. Copolymers may be present as statistical and/or block copolymers. The second elastic polymer may also be a mixture of different polymers, differing for example in structure, monomer composition, block lengths, molecular weights, functional groups, their number and/or distribution. Mixtures of polymers may likewise be used.

In a further embodiment, the second elastic, non-radically crosslinkable polymer has a solubility parameter of 15 to 26 (MPa)$^{1/2}$, in order to allow the second ethylenically unsaturated monomer to be dissolved in sufficient quantity. In a further embodiment, the first and second elastic, non-radically crosslinkable polymers have a solubility parameter of 15 to 26 (MPa)$^{1/2}$. In an additional embodiment, the first and second elastic, non-radically crosslinkable polymers may also have a solubility parameter of 15 to 26 (MPa)$^{1/2}$. The values for certain polymers are listed in the Polymer Handbook by J. Brandrup, E. H. Immergut and E. A. Grulke, 4$^{th}$ edition, Wiley-Interscience, 1999.

Examples of highly suitable, non-radically crosslinkable, elastic polymers for the mask layer (D) are ethylene-vinyl acetates, flexibly elastic polyamides, flexibly elastic polyurethanes, nitrocellulose, polyvinyl acetals such as, for example, poly(vinyl butyral-vinyl alcohol) copolymers, or poly(vinyl butyral-vinyl ethyral-vinyl alcohol) copolymers. Other flexibly elastic materials can of course also be used as binders, such as partially hydrolyzed polyvinyl acetates, for example. A preferred binder for the mask layer (D) is a flexibly elastic polyamide, a polyvinyl alcohol, a partially hydrolyzed polyvinyl acetate or a partially hydrolyzed polyvinyl acetal.

This mask layer (D) may be permeable or impermeable to oxygen, and in the case of an oxygen-impermeable interlayer (C) it preferably is permeable to oxygen. It is also possible for both layers, (C) and (D), to be oxygen-impermeable.

A key property of the relief-forming layer (B), the interlayer (C), and the ablatable mask layer (D) is that they are soluble in the commonplace, commercially available liquids (washout media) which in general consist of solvent mixtures or aqueous solutions. These washout media consist of one or more nonpolar hydrocarbon solvents as the principal constituent, with a secondary constituent in the form of an alcohol of moderate polarity, as for example benzyl alcohol, n-pentanol, cyclohexanol, ethylhexanol, or heptyl alcohols. Aqueous solutions customarily comprise surfactants and/or flocculating agents and in general have a pH>7. The relief-forming layer (B) can be processed in these washout media in customary times. Up to a solids fraction of at least 5 wt %, there is no accompanying fouling of the washout apparatus and no settlement of solids in the washout solution observed.

Furthermore, the relief-forming layer (B), the interlayer (C), and the ablatable mask layer (D) may also be thermally developed or removed (see, for example, EP 1 239 329 or EP 1 170 121). In this case, following Imagine-wise exposure, the relief structures are heated to the softening or melting temperature. This renders the unexposed and noncrosslinked regions of the relief structure partially liquid and tacky, and they are then removed continuously by being suctioned up (absorption) with a nonwoven or a woven fabric.

In a further embodiment, the surface of the relief, after the removal of the layers and of the noncrosslinked regions, has a roughness Rz of less than 20 µm, preferably less than 18 µm, more preferably less than 15 µm. The roughness here is determined using a MarSurf M 300 mobile roughness instrument from Mahr with the "MarWin XR20" software (V 4.26). It uses a contacting speed of 0.5 mm/s and a measuring force of 0.00075 N.

Moreover, in one embodiment, a completed relief structure (after the removal of the layers C and D, and of the noncrosslinked regions, and optionally after re-exposure) exhibits a hardness in the range from 20 to 100° micro-Shore A, preferably in the range from 30° to 90°, more preferably in the range from 40° to 90°, and very preferably in the range from 50° to 85°.

In a further embodiment, between layer (B) and (C) or between layer (C) and (D) in the relief precursor of the invention, there is a further layer (F) which is impermeable to oxygen. If an oxygen-impermeable layer (F) is present, then the layers (B), (C) and/or (D) are preferably permeable to oxygen. The layer thickness of the layer (F) here is in the range from 3 to 5 µm. Besides adjuvants, the layer primarily comprises one or more elastic polymers which have a low oxygen permeability, their oxygen permeability being at a value of less than or equal to $1.5*10^5$ $cm^3*µm/(m^2*d*bar)$. The polymers in the layer (F) preferably are likewise non-radically crosslinkable.

Examples of suitable elastic polymers which can be developed thermally and/or are soluble in organic solvents and which possess a sufficient barrier effect toward oxygen are partially hydrolyzed polyvinyl acetates having a degree of hydrolysis of 30 up to a maximum of 80 mol %, ethylene-vinyl acetate copolymers and ethylene-vinyl alcohol copolymers, and ethylene-vinyl acetate-vinyl alcohol copolymers. Also highly suitable are cyclic acetals of polyvinyl alcohol such as polyvinyl butyral, polyvinyl ethyral, polyvinyl formal, polyvinyl propyral, and also copolymers containing two or more different vinyl acetal units selected from vinyl formal, vinyl ethyral, vinyl propyral, and vinyl butyral units. The polyvinyl acetals are always copolymers with vinyl alcohol units, since the reaction of polyvinyl alcohol to the full acetal is incomplete for statistical and steric reasons. To be exact, therefore, poly(vinylbutyral) is a poly(vinylbutyral-vinyl alcohol). The residual OH content of the stated polyvinyl acetals is customarily between 10 and 30 wt %. Highly suitable, for example, are vinyl ethyral-vinyl butyral-vinyl alcohol copolymers (poly(vinyl ethyral-vinyl butyral)).

In one preferred embodiment, the layers (D) and, if present, (F) likewise comprise at least one second ethylenically unsaturated monomer; in both layers, the monomer or monomers present may be the same or different. The ethylenically unsaturated monomers in question are those described for the layer (C), and may be present in concentrations described for the layer (C).

Another subject of the invention is a process for producing a relief precursor of the invention, comprising the application of the above-described layers to a carrier. This process very generally comprises the following steps:
a) providing a dimensionally stable carrier (A),
b) optionally cleaning the carrier (A),
c) applying the relief-forming layer (B), the interlayer (C), the mask layer (D), and optionally the layer (F),
d) optionally further treating the layer assembly,
e) optionally applying the cover layer (E),
f) optionally further treating the layer construction.

In step a) a dimensionally stable carrier (A) is provided, which may optionally have been provided additionally with further layers, such as with an adhesion promoter layer (AH), for example.

In the optional step b), the surface of the carrier will be cleaned. In this operation, in particular, dust and extraneous particles, and also surface soiling which adversely affects the adhesion (e.g. fingerprints), are removed. Here it is possible to employ all the techniques familiar to the skilled person, such as, for example, brushing, blowing off, wiping (with and without solvent), washing off, and any desired combinations of these. In general, such cleaning is carried out.

In step c) the layers (B), (C), and (D), and optionally (F), are applied; between the application of individual layers, further operating steps may be carried out, such as, for example, drying, irradiating or spraying, and suitable combinations thereof. Layer (F) may be applied between (B) and (C) or between (C) and (D). The layers are customarily applied in liquid form, and not only solutions but also melts may be employed. For individual layers it may also be advantageous to apply them to additional carriers and to apply such assemblies in dry or solid form. The layers may be applied using all of the techniques familiar to the skilled person, such as, for example, laminating, lining, pouring, dipping, spraying, and suitable combinations thereof. It may be necessary here for the solutions, melts and/or layers to be heated or cooled.

Depending on the application techniques, it may be necessary to carry out further treatments on the layer construction in step d). Especially if liquid or solvent-containing mixtures are applied, it may be necessary to carry out drying steps by heating of the layer assembly or evaporation of solvent. It may also be necessary for the layer construction to be treated mechanically, by rolling or pressing, for example. Furthermore, it may be advantageous to irradiate the layer construction at this stage from at least one side, which has corresponding transparency, using electromagnetic waves.

In step e) optionally the protective layer (E) is applied, and the techniques already mentioned above may be employed for this. In step f), optionally, further treatments may follow that are advantageous for further processing. These include, for example, exposure to electromagnetic radiation of at least one of the two sides of the layer structure (which has corresponding transparency), optical quality control for defects and/or contaminants, cutting into predetermined formats, thermal treatment, packing, storage, and any desired combinations thereof.

Another subject of the present invention is a process for producing relief structures using a relief precursor of the invention, which comprises the steps of:
i) provision of a relief precursor of the invention;
ii) optionally, cleaning of the relief precursor;
iii) optionally, irradiation with electromagnetic radiation from a first side;
iv) optionally, removal of the cover layer (E);
v) Imagine-wise ablation of the mask layer (D);
vi) exposure of the relief precursor through the mask layer (D) with electromagnetic radiation;
vii) removal of the layers (C), (D), and optionally (F), and of the noncrosslinked regions of the layer (B); and
viii) optionally, further treatment steps.

In the first step i), the above-described relief precursor is provided. It may optionally be cleaned in step ii), in which case all the techniques familiar to the skilled person may be employed, such as, for example, brushing, blowing off, wiping (with and without solvent), washing off, and any desired combinations thereof.

In the optional step iii), the relief precursor may be irradiated extensively with electromagnetic radiation from at least one side. This irradiation preferably takes place from the side of the relief precursor that is opposite the mask layer, in order to achieve anchoring of the relief structure to be generated (back-side exposure). This back-side exposure takes place preferably through transparent, dimensionally stable materials such as, for example, polymer films, and especially polyester films, as carrier material. In the case of nontransparent carrier materials, step iii) is omitted.

The wavelength of the electromagnetic radiation irradiated is in the range from 200 to 2000 nm, preferably in the UV range, more preferably in the range from 200 to 550 nm, very preferably in the range from 300 to 450 nm. Besides broadband irradiation of the electromagnetic waves, it may be advantageous to use narrowband or monochromatic wavelength ranges, of the kind which can be generated using corresponding filters, lasers, or light-emitting diodes (LEDs). In these cases, preferred wavelengths are in the ranges of 350, 365, 385, 395, 400, 405, 532, 830, 1064 nm individually (and around 5-10 nm above and/or below) or as combinations.

Where a cover layer (E) is present, it may be removed in the optional step iv), this being possible both mechanically and chemically by treatment with solvents, water or aqueous solutions. Preferably the cover layer is a protective film and is peeled off.

In step v), the mask layer is imaged either by removal of the layer and/or by positionally resolved alteration of the absorption and/or reflection properties, in such a way that the mask layer becomes at least partly transparent in the wavelength range used for the imaging. The mask layer is ablated preferably by means of high-energy lasers, with laser beams being guided over the mask layer under computer control. Employed primarily in this case are IR lasers having wavelengths in the range from 500 to 20 000 nm, preferably in the range from 800 to 10 000 nm, more preferably in the range from 1000 to 2000 nm. Especially preferred are wavelengths of around 830 nm, 980 nm, 1064 nm, and 10.6 µm, or combinations thereof.

The exposure of the relief precursor of the invention to electromagnetic radiation in step vi) through the layers (C) and (D) and also, optionally, (F) triggers a reaction, in those regions of the layer (B) that lie beneath the exposed areas of the layer (D), which leads to the crosslinking of the constituents present in the layer. As a result of this crosslinking, these regions are stabilized and cannot be removed in the later development step. The irradiation is generally extensive, but may alternatively be carried out over a small area (virtually dotwise) by means of guided laser beams or positionally resolved projection of electromagnetic radiation. The electromagnetic radiation used for this exposure has wavelengths in the range from 200 to 2000 nm, as already described above.

The irradiation here may take place continuously or in pulsed form or in a plurality of short periods with continuous radiation. The intensity of the radiation here may be varied over a wide range, ensuring that a dose is used which is sufficient to crosslink the layer (B) for the later development procedure. The radiation-induced reaction, possibly after further thermal treatments, must be sufficiently advanced that the exposed regions become at least partly insoluble and can therefore not be removed in the development step vii). The intensity and dose of the radiation are dependent on the reactivity of the formulation and on the duration and efficiency of the development. The intensity of the radiation is in the range from 1 to 15 000 mW/cm$^2$, preferably in the range from 5 to 5000 mW/cm$^2$, more preferably in the range from 10 to 1000 mW/cm$^2$. The dose of the radiation is in the range from 0.3 to 6000 J/cm$^2$, preferably in the range from 3 to 100 J/cm$^2$, more preferably in the range from 6 to 20 J/cm$^2$. Exposure to the energy source may also be carried out in an inert atmosphere, such as in noble gases, $CO_2$ and/or nitrogen, for example, or under a liquid which does not damage the multilayer element.

In step vii), the layers (C), (D), and, if present, the layer (F), and also noncrosslinked regions of the layer (B), are removed, thus generating the relief. The layers may be removed individually or in groups or all together and simultaneously. With preference all the layers and the noncrosslinked regions of (B) are removed in a single step. Depending on the nature of the layers, this may be accomplished both mechanically and chemically by treatment with washout media, such as, for example, organic solvents, mixtures thereof, water, aqueous solutions or aqueous-organic solvent mixtures, which are capable of dissolving, emulsifying and/or dispersing noncrosslinked regions in the layer (B).

The techniques applied in this development step may be all of those familiar to the skilled person. The solvents or mixtures thereof, the aqueous solutions, and the aqueous-organic solvent mixtures may comprise auxiliaries which stabilize the formulation and/or increase the solubility of the components of the noncrosslinked regions. Examples of such auxiliaries are emulsifiers, surfactants, salts, acids, bases, stabilizers, corrosion inhibitors, and suitable combinations thereof. For development with these solutions it is possible to use all of the techniques known to the skilled person, such as, for example, dipping, washing or spraying with the developing medium, brushing in the presence of developing medium, and suitable combinations thereof. Preference is given to developing with neutral aqueous solutions or water, with removal assisted by means of rotating brushes or a plush web. Another way of influencing the development is to control the temperature of the developing medium and to accelerate the development by raising the temperature, for example. In this step it is also possible for further layers still present on the radiation-sensitive layer to be removed, if these layers can be detached during development and sufficiently dissolved and/or dispersed in the developer medium.

Where organic solvents are used, preference is given to using those which have a high flash point, which lies above a temperature of 40° C., more preferably above 60° C. In special cases the flash point may also be above 100° C.

Customary washout media are described in EP 332 070, for example. In general they comprise aliphatic, cycloaliphatic or aromatic hydrocarbons, and one or more alcohols. The majority of washout media used in the market comprise nonpolar hydrocarbons as their main component, and also alcohols of medium polarity in an amount of 10 to 30 wt %. Examples of commercial washout media comprise mixtures containing about 40 wt % of high-boiling hydrocarbon solvents, about 40 wt % of decalin and about 20 wt % of n-pentanol, mixtures comprising about 50 wt % of high-boiling hydrocarbons, about 20 wt % of diisopropylbenzene and about 30 wt % of cyclohexanol, mixtures comprising about 56 wt % of decalin, about 27 wt % of aliphatic hydrocarbon solvents, about 12 wt % of benzyl alcohol and about 2 wt % of ethylhexanol, and also mixtures comprising about 70 wt % of aromatic hydrocarbons and about 30 wt % of heptyl alcohols. In certain cases, terpenes and further components are additionally used, as described in US 2016/0054656, for example.

In the case of the aqueous washout media, alongside mains water, aqueous solutions are used which comprise further constituents, examples being dispersants, emulsifiers, acids, bases, flocculating agents, and salts, and which usually have a pH>7. Dispersants and/or emulsifiers employed are cationic, anionic or nonionic substances or combinations thereof. Examples of anionic compounds are carboxylates such as sodium laurate or sodium oleate, sulfuric ester salts such as sodium lauryl sulfate, sodium cetyl sulfate and sodium oleyl sulfate, alkyl sulfonates, phosphoric esters, or block copolymers with polar and nonpolar blocks.

Examples of organic and inorganic acids which can be used are sulfuric acid, nitric acid, phosphoric acids, formic acid, acetic acid, carboxylic acids, oxalic acid, citric acid, maleic acid or p-toluene sulfonic acid. Examples of bases are alkali metal and alkaline earth metal hydroxides, such as LiOH, KOH, NaOH or CaOH.

Often also used are water-solvent mixtures which permit the employment of a polymer whose water solubility is relatively low. Examples of solvents are methanol, ethanol, isopropanol, benzyl alcohol, cyclohexanol, cellosolve, glycerol, polyethylene glycol, dimethylformamides, dimethylacetamide, and acetone.

In another embodiment, the removal of the layers (C), (D) and, if present, the layer (F) and also of the noncrosslinked regions of the layer (B) in step vii) takes place thermally, in other words by introduction of heat and removal of the softened or partially liquefied material of the layers. The heating of the exposed relief precursor may be carried out by all of the techniques known to the skilled person, such as, for example, by irradiation with IR light, the action of hot gases (e.g., air), using hot rollers, or any desired combinations thereof. To remove the (viscously) liquid regions it is possible to employ all techniques and processes familiar to the skilled person, such as, for example, blowing, suction, dabbing, blasting (with particles and/or droplets), stripping, wiping, transfer to a developing medium, and any desired combinations thereof. Preferably the liquid material is taken up (absorbed and/or adsorbed) by a developing medium which is contacted continuously with the heated surface of the relief precursor. The procedure is repeated until the desired relief height is reached. Developing media which can be utilized are papers, woven and nonwoven fabrics, and films which are able to take up the liquefied material and may consist of natural fibers and/or polymeric fibers. Preference is given to using nonwovens or non-woven fiber webs of polymers such as celluloses, cotton, polyesters, polyamides, polyurethanes, and any desired combinations thereof, which are stable at the temperatures employed when developing.

Subsequent to the preceding steps, it is possible optionally for further treatment steps (viii) to be carried out. These include, for example, a thermal treatment, a drying, a treatment with electromagnetic rays, with plasma, with gases or with liquids, attachment of identification features, cutting to format, coating, and any desired combinations thereof. A thermal treatment may be utilized, for example, to initiate and/or to complete reactions, to increase the mechanical and/or thermal stability of the relief structure, and to remove volatile constituents. For the thermal treatment it is possible to use the known techniques, such as heating using heated gases or liquids, IR radiation, and any desired combinations thereof, for example. In these contexts it is possible to employ ovens, blowers, lamps, and any desired combinations thereof. In addition to disbonding, surface modifications can also be accomplished by the treatment with gases, plasma and/or liquids, especially if in addition there are reactive substances employed as well.

Treatment with electromagnetic radiation may be used, for example, for the purpose of detackifying the surfaces of the relief structure, and triggering and/or completing polymerization reactions and/or crosslinking reactions. The wavelength of the irradiated electromagnetic waves in this case is in the range from 200 to 2000 nm, as already described above.

In a further embodiment, the relief structures generated may be used as printing plates, more particularly as flexographic, letterpress, pad and gravure plates. The relief structures may also find use as optical components—as a Fresnel lens, for example.

If at least one further layer is applied to the relief structures generated, this further layer having a stiffness such that it does not follow the shape of the relief, then components with channels and/or cavities are produced, which may be separate from one another or joined to one another. For this purpose, the further layer may be stiff or inflexible, so that it does not fall into the indentations, although flexible layers may also be used if appropriate measures are taken to ensure that the further layer is unable to fall into the indentations (for example, by filling the indentations with liquids and/or gases and subsequently removing them). These channels and/or cavities may optionally be provided with other materials and/or liquids. Components of these kinds may be used as a microfluidic component (e.g., for microanalysis and/or for high throughput screening), as a micro reactor, optical component, for instance as a phoretic cell (as represented in WO2004/015491, for example), as a light-controlling element for color representation (as described in WO2003/062900, for example), or as photonic crystals. In the course of the aftertreatment in line with step viii), for example, the further layer may be applied. The abovementioned components and structural parts may be either stiff and/or flexible in configuration. Flexible embodiments are especially preferred when they are intended for wear on and/or in the body and/or intended for use in woven fabrics and/or in garments.

Another subject of the invention, therefore, is the use of the relief precursor of the invention as pad printing plate, flexographic plate, letterpress plate, gravure plate, microfluidic component, microreactor, phoretic cell, photonic crystal and optical component.

The invention is elucidated in more detail by the examples below.

EXAMPLES

Determination of the Micro-Shore A Hardness

The micro-Shore A hardness was measured on specimens having a thickness of 1.7 mm and after exposure, development, drying and re-exposure, using a digi test II-M Shore A instrument (Bareiss Prüfgerätebau GmbH), which was installed in the B509 test bed (Bareiss Prüfgerätebau GmbH) and was controlled by the DTAA control unit (Bareiss Prufgeratebau GmbH). The measuring head (penetration body with 35° angle) was applied to a solid area for the purpose of the measurement, and was pressed by the digi test II analysis instrument with a pressing force of 235 mN and the hardness value was read off after 3 s. Measurement was carried out twice, and the arithmetic mean was formed. The measurements were carried out on the basis of DIN ISO 7619.

Perthometer Measurements for Determining the Roughness:

The Perthometer measurements were carried out with a MarSurf M 300 mobile roughness instrument from Mahr with the "MarWin XR20" software (V 4.26). A contacting speed of 0.5 mm/s and a measuring force of 0.00075 N were used.

Oxygen Permeation Measurements:

The oxygen permeability is determined by the carrier gas technique in accordance with ASTM D3985 in instruments from Mocon Inc. with a coulometric sensor, at 23° C. and 0% relative humidity. The samples were measured freestanding, with the measurement area being 5 cm² or 10 cm² and the sample thickness being between 75 and 108 μm.

UV-VIS Measurement:

For transparency measurement, the layer constituents were dissolved in a suitable solvent mixture and the solution was drawn down onto a transparent PET film (125 μm thickness). The assembly was subsequently dried in a drying cabinet at 110° C. for 30 minutes. The transparency measurement was carried out using a UV-VIS spectrometer Varian Cary 50 Conc with the Cary Win UV software in version 2.00(25). This was done by subtracting the values of the uncoated PET film as reference/baseline. Measurement took place in the wavelength range from 500 to 350 nm.

Determination of Cupping:

To determine the cupping, the 50% halftones at 146 lpi were measured using a MarSurf M 300 mobile roughness instrument from Mahr with "MarWin XR20" software (V 4.26). A contacting speed of 0.5 mm/s and a measuring force of 0.00075 N were used. Subsequently the shape of the individual halftone dots was analyzed, and a difference between the height of the margin and the middle of the dots was determined, the value of this difference being denoted as cupping and reported in μm. In each case three dots were measured, and the arithmetic mean was formed.

Analysis of Fluting:

For analysis of the fluting, a selected motif with a resolution of 2540 dpi was printed using different print precursors of thickness type 394 on a Bobst FFG 1228 NTRS Rapidset at a speed of 110 m/min using an anilox roll with a transfer volume of 15 cm³/m². The ink used was from Siegwerk (black) and had a viscosity of 21 s. The washboard effect was assessed on these motifs, and divided into different classes. Motifs with severe fluting received the classification "−", those with moderate fluting the classification "0", and those with relatively minor fluting the category "+".

Determination of Amount of Ethylenically Unsaturated Monomer in the Interlayer:

To determine the amount of the ethylenically unsaturated monomer present, here by way of example the HDDA content, the interlayer, without laser-ablatable mask layer, was applied to the photopolymer by extrusion and left there for four weeks. The interlayer was subsequently peeled off together with the cover film. 318 cm² of the film with the layer were placed in 100 g of ethanol, in order to dissolve the HDDA and the layer binder. Differential weighing of the cover film with the layer and the film without the layer gave the surface weight of the interlayer. Subsequently, by means of GC analysis, a calibration curve was produced, by measuring different concentrations of a standard solution with a defined HDDA content (1.009 g in 20 ml of ethanol), and the HDDA content of the solution was determined. With the HDDA content of the solution and the surface weight of the interlayer, the HDDA content in the layer was calculated in accordance with the following formula:

$$\frac{\text{fraction of } HDDA \text{ in sample solution } \left[\frac{g}{ml}\right] * \text{size of the sample amount [ml]}}{\text{surface weight found } \left[\frac{g}{m^2}\right] * \text{area used } [m^2]}$$

The GC analyses were performed on a Perkin Elmer Clarus 500 with a TurboMatrix 40 sample collector and the TotalChrom software (Version 6.3.2). For the sample measurement, 1 μl of the extraction solution prepared was injected at the normal rate. The temperatures of the detectors were 200° C. and 310° C. The measurement was carried out over 28.5 minutes at a data rate of 12.5 pts. The individual constituents were separated using a Perkin Elmer Elite Series column (Perkin Elmer; PE17-HT, N931-6264 with a length of 30 m and internal diameter of 0.25 mm and also with a 0.15 μm film). Carrier gases used were compressed air and hydrogen. The gas flow rate was 450 ml/min for compressed air and 45 ml/min for hydrogen.

Example 1

Production of materials in plate form: A photopolymeric mixture containing 73.75 parts of an SIS block copolymer (SIS triblock, with a styrene content of 14 to 15% and a diblock fraction of around 26%, vinyl group portion around 7-8%) as binder, 9.3 parts of hexanediol diacrylate (HDDA), 3.3 parts of hexanediol dimethacrylate, 5 parts of diisononyl cyclohexane-1,2-dicarboxylate as plasticizer and 5 parts of vinyltoluene-methylstyryl copolymer as extrusion assistant and also 2.5 parts of benzil dimethyl ketal as photoinitiator, and 1.25 parts of further constituents such as inhibitors and dyes, was melted at elevated temperatures (120 to 180° C.) in an extruder and calendared via a slot die between a cover film with laser-ablatable mask layer and optionally an interlayer containing 71 parts of polyvinyl butyral (OH fraction 18-21%, 14-20 mPas as 10% ethanolic solution), 15 parts of an inorganic, silicatic filler and 5 parts of an adhesion-promoting component and also ethylenically unsaturated monomer (HDDA) with a thickness of 100 µm, and a carrier film having a thickness of 125 µm, thus giving the relief precursor (photopolymer+films) a thickness of 1855 µm. The oxygen permeability of the interlayer was $6*10^4$ $cm^3*µm/(m^2*d*bar)$.

Various tonal value fields with between 1 and 100% coverage and with a halftone width of 146 lpi were generated on the precursors by laser ablation. The ablation was performed using a ThermoFlexx laser (Xeikon) with Multiplate software (Version 5.0.0.309) and the following parameters: wavelength 1064 nm, 10.5 revolutions per second, 35 W laser power. UV exposure took place using a Combi Fill exposure unit (Flint group) with tube light of intensity 13 mW/cm² (solvent development) for 15 min or 24 mW/cm² for 10 min (thermal development). Developing then took place with solvent in an Fill washout unit (Flint group) at 35° C., using nylosolv A (Flint group) as developing solution. Drying was carried out over 2 hours at 60° C. and at the same time there was re-exposure with UVA for 10 minutes and UVC for 5 minutes in a Combi Fill exposure unit (Flint group). As an alternative, a portion of the samples were developed with a nyloflex Xpress F IV device (Flint group, thermal development at a temperature of 163° C. (325° F.) and 14 revolutions with a pressing pressure of 4.13 bar (60 psi) and a speed of 0.7"/s, with simultaneous re-exposure with UVA for 10 minutes and UVC for 6 minutes in a Combi Fill exposure unit (Flint group).

Samples from the 50% halftone were taken from the completed relief structures and were measured for cupping (table 1a).

| Example | Interlayer | Fraction of HDDA in interlayer | Cupping depth, solvent development (standardized to example a1) | Cupping depth, thermal development (standardized to example a1 thermal) | Micro-Shore A | Thickness of interlayer (µm) |
|---|---|---|---|---|---|---|
| Example 1a | No | 0% | 1 | 1 | 65.4 | |
| Example 1b | Yes | 7 ± 2 | 0.87 | 0.59 | 65.8 | 4 ± 1 |
| Example 1c | Yes | 9 ± 1% | 0.82 | 0.43 | 65.1 | 4 ± 1 |
| Example 1d | Yes | 0 | 1 | 1 | 65.4 | 4 ± 1 |

As can be inferred from the table above, the monomer in the interlayer reduces the cupping. The best result is achieved with 9% HDDA in the interlayer and thermal development, although even relatively small concentrations already produce a significant reduction. Presumably the cupping is reduced since monomer is able to diffuse from the interlayer into the exposed regions from above as well and not just from the unexposed regions, from the side.

Example 2

Production of materials in plate form: A photopolymeric mixture containing 65 parts of an SBS block copolymer (SBS triblock, having a styrene content of 31% and a diblock fraction of around 17%) as binder, 6.5 parts of hexanediol diacrylate, and 2.5 parts of benzil dimethyl ketal as photoinitiator, 1 part of further constituents such as inhibitors and dyes, and 25 parts of a polybutadiene oil (vinyl content 2%, $M_n$=5000 g/mol) as plasticizer, was melted at elevated temperatures (120-180° C.) in an extruder and calendared via a slot die between a cover film with laser-ablatable mask layer and optionally an interlayer containing 90 parts of polyvinyl butyral (OH fraction 18 to 21%, 14 to 20 mPas measured as a 10% ethanolic solution), 4 parts of an adhesion promoter and optionally 6 parts of monomer (HDDA), with a thickness of 100 µm, and a carrier film having a thickness of 125 µm, thus giving the relief precursor (photopolymer+films) a thickness of 4100 µm. The oxygen permeability of the interlayer was $5.8*10^4$ $cm^3*µm/(m^2*d*bar)$.

Various tonal value fields between 1 and 100% coverage with a halftone width of 146 lpi, and also various images, were generated on the precursors by laser ablation. The ablation was performed using a ThermoFlexx laser (Xeikon) with Multiplate software (Version 5.0.0.309) and the following parameters: wavelength 1064 nm, 10.5 revolutions per second, 35 W laser power. Exposure was carried out with a Combi Fill exposure unit (Flint group), using tube light with an intensity of 24 mW/cm² for 10 min. Development was carried out in an Fill washout unit (Flint group) at 35° C., using nylosolv A (Flint group) as developing solution. Drying took place over 2 hours at 60° C., with simultaneous re-exposure with UVA for 10 minutes and UVC for 4 minutes, in parallel, in a Combi Fill exposure unit (Flint group).

| Example | Interlayer | HDDA (wt %) | Fluting assessment |
|---|---|---|---|
| Example 2a | Yes | 0 | − |
| Example 2b | Yes | 7 ± 2 | + |
| Example 2c | No | − | − |

The print results show that it is possible to achieve a significant reduction in fluting by using a monomer-containing interlayer. As a result of the HDDA in the interlayer, there is presumably a better and more uniform crosslinking at the plate surface, which is capable of compensating the fluctuations in the substrate in the case of the corrugated card.

Example 3

The relief precursors were produced by the method described above (example 1) with an HDDA content of 7±2% and were developed by solvent washout. For the experiments in this example, different polymers were used as binders of the interlayer:

PVA: OH fraction 71.5 mol % to 73.5%, 5.6-6.6 mPas, as 4% aqueous solution

PVB: OH fraction 18 to 21 mol %, 14 to 20 mPas, as 10% ethanol solution

PA: softening point 130 to 155° C., MFR at 175° C.: 5 to 15 g/10 min, low-temperature flexibility −40° C.

| | Polymer in the interlayer | Solubility parameter of polymer $((MPa)^{1/2})$ | O2 permeability of interlayer $(cm^3*\mu m/(m^2*d*bar))$ | Particle (type and size) | Thickness of interlayer ($\mu m$) | Cupping |
|---|---|---|---|---|---|---|
| Example 3a | PVA | 21-26 | $8.5 * 10^2$ | — | 5 ± 1 | 0 |
| Example 3b | PVB | 23 | $8.5 * 10^4$ | silica, 4-6 $\mu m$ | 5 ± 1 | + |
| Example 3c | PA | 19-27 | $2.0 * 10^5$ | — | 4 ± 1 | + |
| Example 3d | PA | 19-27 | $3.7 * 10^5$ | silica, 4-6 $\mu m$ | 5 ± 1 | + |

Example 4

The relief precursors were produced by the method described above (example 2) with an HDDA content of 7±2%. For the experiments in this example, different polymers were used as binders of the interlayer:
  BUNA S, styrene fraction 30 mol % (comparative example, crosslinkable polymer)
  PU: aromatic polyisocyanate based on tolylene diisocyanate, NCO content 12 mol %, equivalent weight about 350
  PVB: OH fraction 18 to 21 mol %, 14 to 20 mPas, as 10% ethanol solution
  PA: softening point 130 to 155° C., MFR at 175° C.: 5 to 15 g/10 min, low-temperature flexibility −40° C.
  Ethyl cellulose: ethoxy fraction 48 to 49.5 mol %, 90 to 110 mPas, as 5% solution in 80% toluene and 20% ethanol

| | Polymer in the interlayer | Solubility parameter of polymer $((MPa)^{1/2})$ | O2 permeability or interlayer $(cm^3 * \mu m/(m^2 * d * bar))$ | Particle (type and size) | Thickness of interlayer ($\mu m$) | Fluting |
|---|---|---|---|---|---|---|
| Example 4a | BUNA S | 17 | | — | 4 ± 1 | − |
| Example 4b | PU | 23 | | silica 4-6 $\mu m$ | 5 ± 1 | 0 |
| Example 4c | PVB | 23 | $8.5 * 10^4$ | | 5 ± 1 | + |
| Example 4d | PA | 19-27 | $2.0 * 10^5$ | — | 4 ± 1 | + |
| Example 4e | PA | 19-27 | $3.7 * 10^5$ | silica, 4-6 $\mu m$ | 5 ± 1 | + |
| Example 4f | Ethyl cellulose | 20-21 | | — | 4 ± 1 | + |

The invention claimed is:

1. A digitally imageable, photopolymerizable relief precursor at least comprising, arranged one above another in the order stated,
  (A) a dimensionally stable carrier;
  (AH) optionally, an adhesion-promoting layer;
  (B) a relief-forming layer, at least comprising a crosslinkable elastomeric binder, a first ethylenically unsaturated monomer, and a photoinitiator;
  (C) at least one interlayer, at least comprising a first, non-radically crosslinkable elastic polymer;
  (D) a laser-ablatable mask layer, at least comprising a second, non-radically crosslinkable elastic polymer, a UVA light-absorbing material, and an IR light-absorbing material; and optionally
  (E) a removable cover layer;
  characterized in that the layer (C) and optionally the layer (D) comprise at least one second ethylenically unsaturated monomer, and in that the concentration of the first ethylenically unsaturated monomer in layer (B) and the concentration of the second ethylenically unsaturated monomer in interlayer (C) differ by not more than ±2 wt %, based in each case on all the components of the layers (B) and (C) respectively.

2. The relief precursor as claimed in claim 1, characterized in that the layer thickness S of the interlayer (C) is from 0.1 to 30 $\mu m$.

3. The relief precursor as claimed in claim 1, characterized in that the first and second ethylenically unsaturated monomers are the same ethylenically unsaturated monomer.

4. The relief precursor as claimed in claim 1, characterized in that the second ethylenically unsaturated monomer is present in the interlayer (C) in a concentration K which is the same as or lower than the concentration of the first ethylenically unsaturated monomer in the relief-forming layer (B).

5. The relief precursor as claimed in claim 1, characterized in that the second ethylenically unsaturated monomer is present in the interlayer (C) in a concentration K of 0.1 to 25 wt %, based on all the components of the interlayer (C).

6. The relief precursor as claimed in claim 1, characterized in that the ratio of the layer thickness S of the interlayer (C) in $\mu m$ to the concentration K of the first ethylenically unsaturated monomer in wt % is from 30:0.1 to 0.1:25 $\mu m$/wt %.

7. The relief precursor as claimed in claim 1, characterized in that the first and second ethylenically unsaturated monomers have at least 2 ethylenically unsaturated groups and a molecular weight of less than 600 g/mol.

8. The relief precursor as claimed in claim 1, characterized in that the first elastic, non-radically crosslinkable polymer has a solubility parameter of 15 to 26 $(MPa)^{1/2}$.

9. The relief precursor as claimed in claim 1, characterized in that the first and second elastic, non-radically crosslinkable polymers have a solubility parameter of 15 to 26 $(MPa)^{1/2}$.

10. The relief precursor as claimed in claim 1, characterized in that the first elastomeric, non-radically crosslinkable polymer in interlayer (C) has an oxygen permeability of less than or equal to $1.5*10^5$ $cm^3*\mu m/(m^2*d*bar)$.

11. The relief precursor as claimed in claim 1, characterized in that the first elastomeric, non-radically crosslinkable polymer in interlayer (C) has an oxygen permeability of greater than $1.5*10^5$ $cm^3*\mu m/(m^2*d*bar)$.

12. The relief precursor as claimed in claim 1, characterized in that the interlayer (C) comprises the first elastomeric, non-radically crosslinkable polymer in a concentration of 60 to 99 wt %, based on all the components of the interlayer (C).

13. The relief precursor as claimed in claim 1, characterized in that the interlayer (C) comprises particles having a particle size of 0.2 to 30 $\mu m$.

14. The relief precursor as claimed in claim 1, characterized in that the interlayer (C) comprises particles in a concentration of 0.5 to 35 wt %, based on all the components of the interlayer (C).

15. The relief precursor as claimed in claim 13, characterized in that the particles comprise the second ethylenically unsaturated monomer.

16. The relief precursor as claimed in claim 1, characterized in that between the relief-forming layer (B) and the interlayer (C) or between the interlayer (C) and the mask layer (D) it comprises a further layer (F) which is impermeable to oxygen.

17. The relief precursor as claimed in claim 16, characterized in that the layer (F) comprises a second ethylenically unsaturated monomer.

18. The relief precursor as claimed in claim 1, characterized in that the mask layer (D) comprises a second ethylenically unsaturated monomer.

19. A digitally imageable, photopolymerizable relief precursor at least comprising, arranged one above another in the order stated,
(A) a dimensionally stable carrier;
(AH) optionally, an adhesion-promoting layer;
(B) a relief-forming layer, at least comprising
a crosslinkable elastomeric binder,
a first ethylenically unsaturated monomer, and
a photoinitiator;
(C) at least one interlayer, at least comprising
a first, non-radically crosslinkable elastic polymer;
(D) a laser-ablatable mask layer, at least comprising
a second, non-radically crosslinkable elastic polymer,
a UVA light-absorbing material, and
an IR light-absorbing material; and optionally
(E) a removable cover layer;
characterized in that
the layer (C) comprises at least
a second ethylenically unsaturated monomer, and
in that the concentration of the first ethylenically unsaturated monomer in layer (B) and the concentration of the second ethylenically unsaturated monomer in interlayer (C) differ by not more than ±2 wt %, based in each case on all the components of the layers (B) and (C) respectively; and
in that the first elastic, non-radically crosslinkable polymer has a solubility parameter of 15 to 27 $(MPa)^{1/2}$ to allow the second ethylenically unsaturated monomer to be dissolved in layer (C).

20. A digitally imageable, photopolymerizable relief precursor at least comprising, arranged one above another in the order stated,
(A) a dimensionally stable carrier;
(AH) optionally, an adhesion-promoting layer;
(B) a relief-forming layer, at least comprising
a crosslinkable elastomeric binder,
a first ethylenically unsaturated monomer, and
a photoinitiator;
(C) at least one interlayer, at least comprising
a first, non-radically crosslinkable elastic polymer;
(D) a laser-ablatable mask layer, at least comprising
a second, non-radically crosslinkable elastic polymer,
a UVA light-absorbing material, and
an IR light-absorbing material; and optionally
(E) a removable cover layer;
characterized in that
the layer (C) comprises at least
a second ethylenically unsaturated monomer, and in that the concentration of the first ethylenically unsaturated monomer in layer (B) and the concentration of the ethylenically unsaturated monomer in interlayer (C) differ by not more than ±2 wt %, based in each case on all the components of the layers (B) and (C) respectively; and in that
the first, non-radically crosslinkable elastic polymer is chosen from hydrolyzed polyvinyl acetates having a degree of hydrolysis of 30 to 80 mol %, ethylene-vinyl acetate copolymers, ethylene-vinyl alcohol copolymers, ethylene-vinyl acetate-vinyl alcohol copolymers, cyclic acetals of polyvinyl alcohol, copolymers containing two or more different vinyl acetal units selected from vinyl formal, vinyl ethyral, vinyl propyral, and vinyl butyral units.

\* \* \* \* \*